(12) United States Patent
Van Herpen et al.

(10) Patent No.: US 7,518,128 B2
(45) Date of Patent: Apr. 14, 2009

(54) LITHOGRAPHIC APPARATUS COMPRISING A CLEANING ARRANGEMENT, CLEANING ARRANGEMENT AND METHOD FOR CLEANING A SURFACE TO BE CLEANED

(75) Inventors: Maarten Marinus Johannes Wilhelmus Van Herpen, Heesch (NL); Derk Jan Wilfred Klunder, Geldrop (NL)

(73) Assignee: ASML Netherlands B.V., Veldhoven (NL)

( * ) Notice: Subject to any disclaimer, the term of this patent is extended or adjusted under 35 U.S.C. 154(b) by 220 days.

(21) Appl. No.: 11/478,303

(22) Filed: Jun. 30, 2006

(65) Prior Publication Data
US 2008/0001101 A1  Jan. 3, 2008

(51) Int. Cl.
*G21G 1/12* (2006.01)
*G03F 7/20* (2006.01)
*B08B 7/00* (2006.01)

(52) U.S. Cl. ............... 250/492.2; 250/492.1; 250/493.1; 250/504 R; 355/30; 355/53; 355/67; 430/311; 430/269; 134/1.1; 134/31; 134/34; 134/37; 134/39

(58) Field of Classification Search ............... 250/492.1, 250/492.2, 493.1, 504 R; 355/30, 53, 67; 430/311, 269; 134/1.1, 31, 34, 37, 39
See application file for complete search history.

(56) References Cited

U.S. PATENT DOCUMENTS 5,068,040 A * 11/1991 Jackson ..................... 210/748

| 2004/0165160 | A1* | 8/2004 | Van Beek et al. ............. 355/30 |
| 2005/0128452 | A1* | 6/2005 | Matsumoto ................... 355/55 |
| 2006/0072084 | A1* | 4/2006 | Van Herpen et al. .......... 355/30 |
| 2006/0115771 | A1* | 6/2006 | Wilhelmus Van Herpen et al. ........ 430/311 |
| 2006/0163500 | A1* | 7/2006 | Inoue et al. .............. 250/493.1 |
| 2007/0040999 | A1* | 2/2007 | Wilhelmus Van Herpen et al. .......... 355/30 |
| 2007/0145295 | A1* | 6/2007 | Banine et al. ............ 250/492.2 |

FOREIGN PATENT DOCUMENTS

EP        1 643 310 A1     4/2006

OTHER PUBLICATIONS

International Search Report issued for PCT Patent Application No. PCT/NL2007/050308, dated Nov. 6, 2007.

* cited by examiner

*Primary Examiner*—Jack I Berman
*Assistant Examiner*—Michael Maskell
(74) *Attorney, Agent, or Firm*—Pillsbury Winthrop Shaw Pittman LLP

(57) ABSTRACT

A cleaning arrangement is provided for use in an EUV lithographic apparatus, for example an EUV lithographic apparatus with a Sn source. The cleaning arrangement includes a gas source for a hydrogen containing gas and a hydrogen radical source. The hydrogen radical source is a source of (UV) radiation which induces photo dissociation of the hydrogen. Radicals may reduce Sn oxides (if present) and my form volatile hydrides of Sn deposition and/or carbon deposition. In this way the cleaning arrangement can be used to clean optical elements from Sn and/or C deposition. The EUV source may be used as hydrogen radical source. An optical filter is used to remove undesired EUV radiation and transmit desired UV radiation.

20 Claims, 4 Drawing Sheets

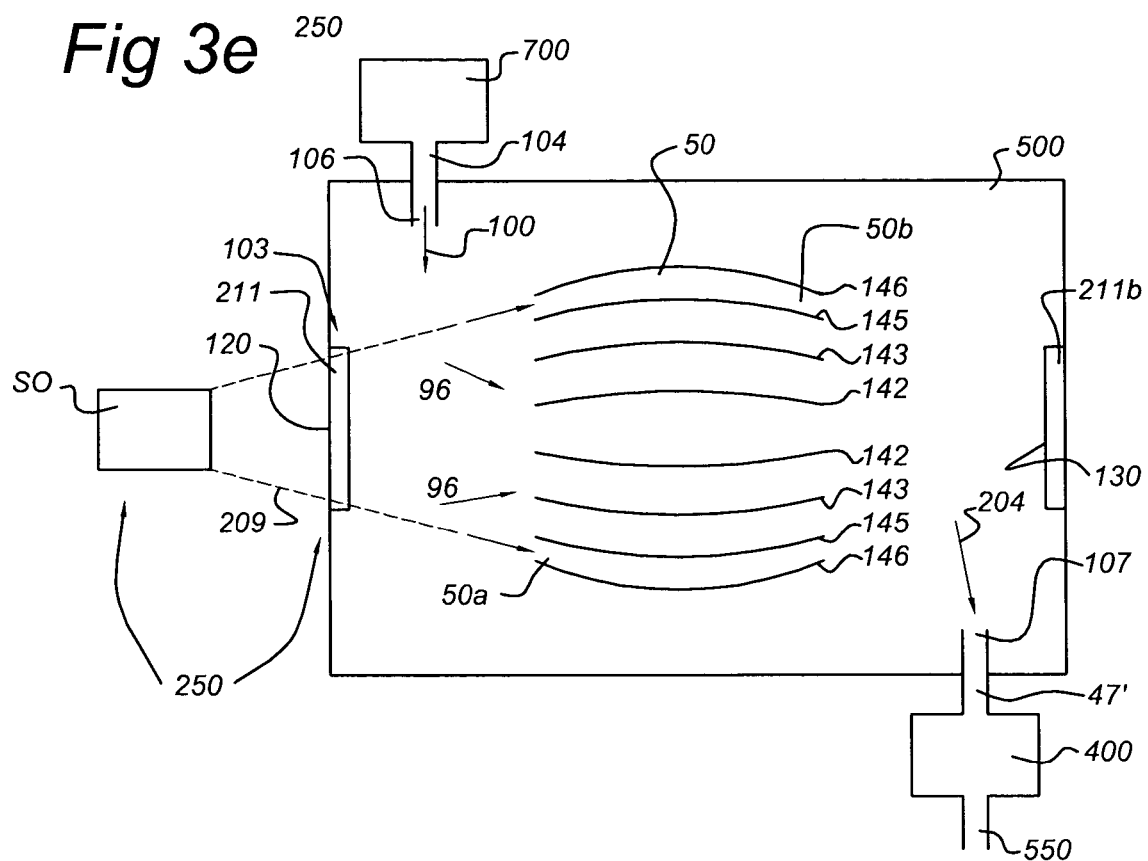
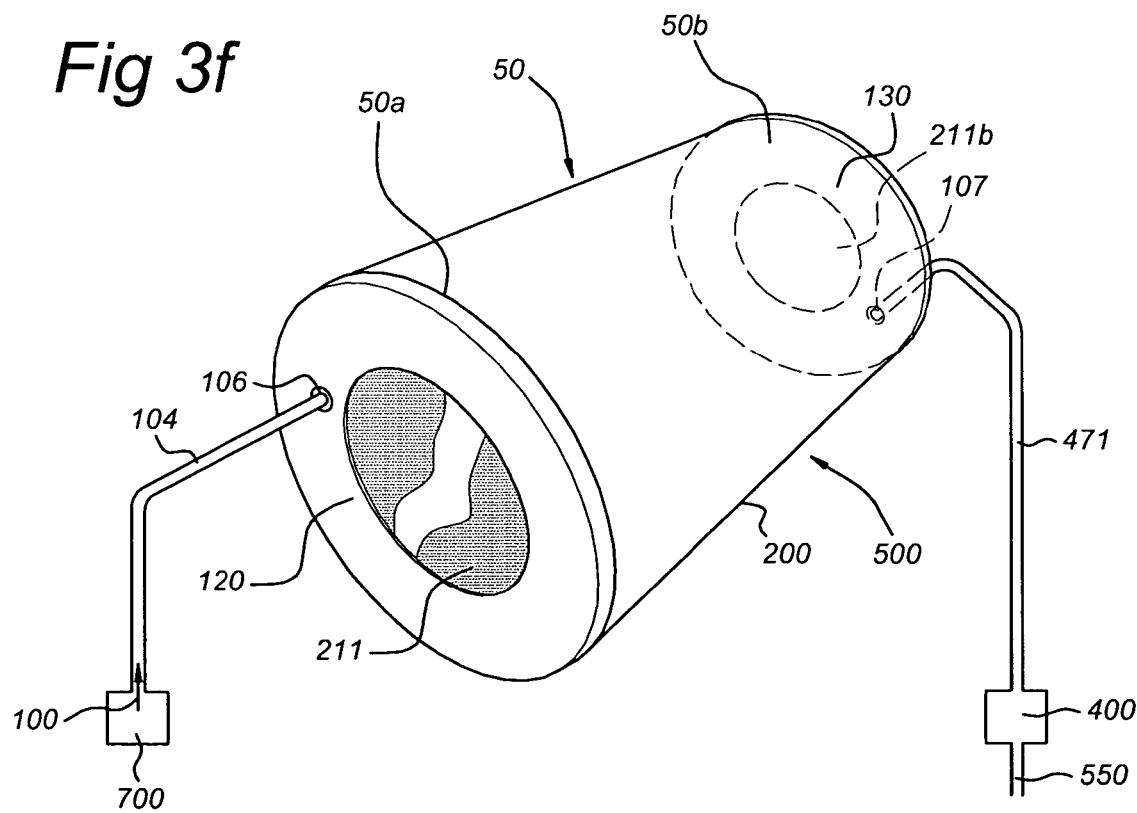

LITHOGRAPHIC APPARATUS COMPRISING A CLEANING ARRANGEMENT, CLEANING ARRANGEMENT AND METHOD FOR CLEANING A SURFACE TO BE CLEANED

BACKGROUND OF THE INVENTION

1. Field of the Invention

The present invention relates to a lithographic apparatus comprising a cleaning arrangement. The present invention also relates to a cleaning arrangement. The present invention further relates to a method for cleaning a surface to be cleaned, for instance a surface of an optical element within the lithographic apparatus.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus comprise steppers, in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

In a lithographic apparatus, the size of features that can be imaged onto the substrate is limited by the wavelength of the projection radiation. To produce integrated circuits with a higher density of devices, and hence higher operating speeds, it is desirable to be able to image smaller features. While most current lithographic projection apparatus employ ultraviolet light generated by mercury lamps or excimer lasers, it has been proposed to use shorter wavelength radiation, e.g. of around 13 nm. Such radiation is termed extreme ultraviolet (EUV) or soft x-ray, and possible sources comprise, for example, laser-produced plasma sources, discharge plasma sources, or synchrotron radiation from electron storage rings.

The source of EUV radiation is typically a plasma source, for example a laser-produced plasma or a discharge source. A common feature of any plasma source is the production of fast ions and atoms, which are expelled from the plasma in all directions. These particles can be damaging to the collector and condenser mirrors which are generally multilayer mirrors or grazing incidence mirrors, with fragile surfaces. This surface is gradually degraded due to the impact, or sputtering, of the particles expelled from the plasma and the lifetime of the mirrors is thus decreased. The sputtering effect is particularly problematic for the radiation collector. The purpose of this mirror is to collect radiation which is emitted in all directions by the plasma source and direct it towards other mirrors in the illumination system. The radiation collector is positioned very close to, and in line-of-sight with, the plasma source and therefore receives a large flux of fast particles from the plasma. Other mirrors in the system are generally damaged to a lesser degree by sputtering of particles expelled from the plasma since they may be shielded to some extent.

In the near future, extreme ultraviolet (EUV) sources will probably use tin (Sn) or another metal vapor to produce EUV radiation. This tin may leak into the lithographic apparatus, and will be deposited on mirrors in the lithographic apparatus, e.g. the mirrors of the radiation collector (also called collector). The mirrors of such a radiation collector may have a EUV reflecting top layer of, for example, ruthenium (Ru). Deposition of more than approximately 10 nm tin on the reflecting Ru layer will reflect EUV radiation in the same way as bulk Sn. It is envisaged that a layer of a few nm Sn is deposited very quickly near a Sn-based EUV source. The overall transmission of the collector may decrease significantly, since the reflection coefficient of tin is much lower than the reflection coefficient of ruthenium. In order to prevent debris from the source or secondary particles generated by this debris from depositing on the radiation collector, contaminant barriers may be used. Though such contaminant barriers may remove part of the debris, still some debris will deposit on the radiation collector or other optical elements. Further, also carbon (C) may deposit on optical elements like mirrors, which may also lead to a decrease in optical properties like reflection, etc.

SUMMARY OF THE INVENTION

It is desirable to provide a cleaning arrangement for a lithographic apparatus which cleaning arrangement can be used in a process for the removal of carbon or tin or both. It is further desirable to provide a method for cleaning carbon or tin or both carbon and tin from a surface to be cleaned from carbon or tin or both carbon and tin.

According to a first embodiment of the invention, there is provided a lithographic apparatus, the lithographic apparatus comprising an EUV source, the lithographic apparatus further comprising a cleaning arrangement, the cleaning arrangement comprising a hydrogen containing gas source and a hydrogen radical source, wherein the hydrogen radical source is configured to convert at least part of the hydrogen containing gas into a hydrogen radical containing gas, wherein the cleaning arrangement is configured to provide the hydrogen radical containing gas to a surface of an optical element to be cleaned, and wherein the hydrogen radical source comprises a source of radiation which induces photo dissociation of the hydrogen.

According to a further embodiment of the invention, there is provided a cleaning arrangement for instance for a lithographic apparatus, the cleaning arrangement comprising a hydrogen containing gas source and a hydrogen radical source, wherein the hydrogen radical source is configured to convert at least part of the hydrogen containing gas into a hydrogen radical containing gas, wherein the cleaning arrangement is configured to provide the hydrogen radical containing gas to a surface of an optical element to be cleaned, wherein the hydrogen radical source comprises a source of radiation which induces photo dissociation of the hydrogen.

According to next embodiment of the invention, there is provided a method for cleaning a surface to be cleaned of an optical element of a lithographic apparatus, the method comprising leading a hydrogen containing gas to the surface to be cleaned and irradiating the gas or the surface to be cleaned or both with radiation which induces photo dissociation of the hydrogen.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 3a-3f depict embodiments of the cleaning arrangement according to the invention, especially the cleaning arrangement in combination with a lithographic apparatus.

DETAILED DESCRIPTION

Figure 1:
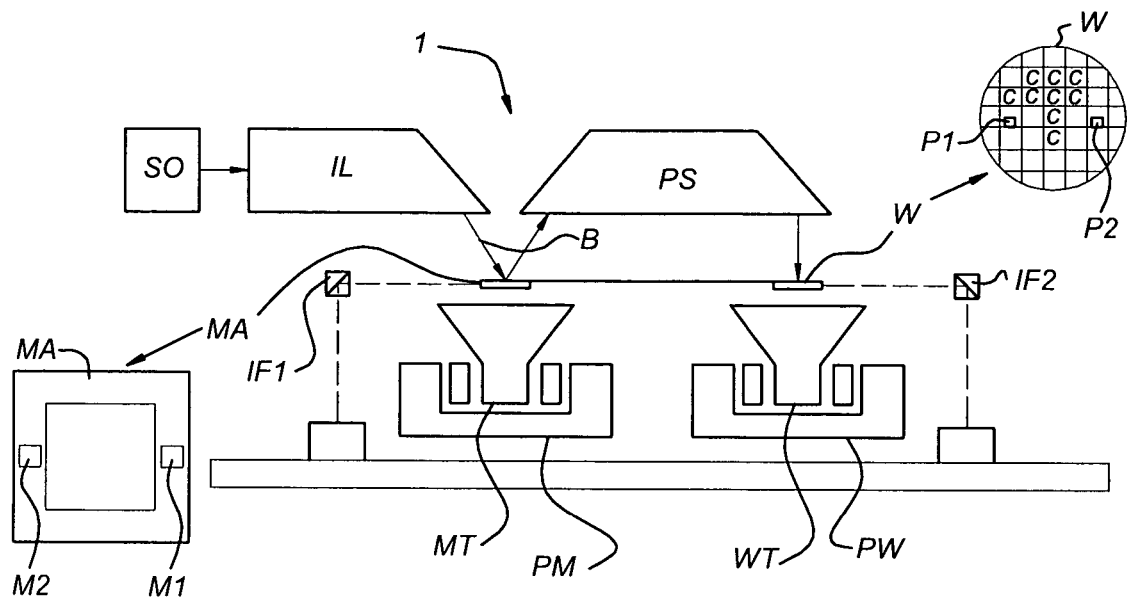
FIG. 1 depicts a lithographic apparatus according to an embodiment of the invention.

FIG. 1 schematically depicts a lithographic apparatus 1 according to one embodiment of the invention. The apparatus 1 comprises an illumination system (illuminator) IL configured to condition a radiation beam B (e.g. UV radiation or EUV radiation). A support (e.g. a mask table) MT is configured to support a patterning device (e.g. a mask) MA and is connected to a first positioner PM configured to accurately position the patterning device in accordance with certain parameters. A substrate table (e.g. a wafer table) WT is configured to hold a substrate (e.g. a resist-coated wafer) W and is connected to a second positioner PW configured to accurately position the substrate in accordance with certain parameters. A projection system (e.g. a refractive projection lens system) PS is configured to project a pattern imparted to the radiation beam B by patterning device MA onto a target portion C (e.g. comprising one or more dies) of the substrate W.

The illumination system may comprise various types of optical components, such as refractive, reflective, magnetic, electromagnetic, electrostatic or other types of optical components, or any combination thereof, to direct, shape, or control radiation.

The support supports, e.g. bears the weight of, the patterning device. It holds the patterning device in a manner that depends on the orientation of the patterning device, the design of the lithographic apparatus, and other conditions, such as for example whether or not the patterning device is held in a vacuum environment. The support can use mechanical, vacuum, electrostatic or other clamping techniques to hold the patterning device. The support may be a frame or a table, for example, which may be fixed or movable as required. The support may ensure that the patterning device is at a desired position, for example with respect to the projection system. Any use of the terms "reticle" or "mask" herein may be considered synonymous with the more general term "patterning device."

The term "patterning device" used herein should be broadly interpreted as re device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern comprises phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices comprise masks, programmable mirror arrays, and programmable LCD panels. Masks are well known in lithography, and comprise mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, comprising refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives radiation from a radiation source SO. The source and the lithographic apparatus may be separate entities, for example when the source is an excimer laser. In such cases, the source is not considered to form part of the lithographic apparatus and the radiation is passed from the source SO to the illuminator IL with the aid of a beam delivery system comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser.

The illuminator may be used to condition the radiation beam, to have a desired uniformity and intensity distribution in its cross-section.

The radiation beam B is incident on the patterning device (e.g., mask MA), which is held on the support (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 (e.g. an interferometric device, linear encoder or capacitive sensor) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper, as opposed to a scanner, the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In an embodiment according to the invention, there is provided a lithographic apparatus comprising an illumination system configured to condition a radiation beam; a support configured to support a patterning device, the patterning device being configured to impart the radiation beam with a pattern in its cross-section to form a patterned radiation beam; a substrate table configured to hold a substrate; a projection system configured to project the patterned radiation beam onto a target portion of the substrate, and a cleaning arrangement according to the invention. In a further embodiment, the lithographic apparatus comprises an EUV source, which is configured to generate a beam of EUV radiation for EUV lithography. In general, the EUV source is configured in a radiation system (see below). The illumination system is configured to condition the EUV radiation beam of the EUV source.

The term "halogen containing gas" or "hydrogen containing gas" refers to gasses or gas mixtures comprising at least a halogen gas or hydrogen gas, respectively. The term "halogen" in the term "halogen containing gas" refers to at least one or more selected of F, Cl, Br and I, either as an atom (radical) or as compound, for example $F_2$, $Cl_2$, $Br_2$, $I_2$, HF, HCl, HBr, HI, interhalogen compounds, for example $ClF_3$, or other compounds comprising one or more selected from F, Cl, Br and I which can be brought into the gas phase at a temperature between about 50-500°. In an embodiment one or more of $F_2$, $Cl_2$, $Br_2$, $I_2$ may be used, in particular $I_2$. The terms "hydrogen" and "hydrogen radicals" comprise their isotopes as well, in particular, deuterium. Hence, the term "hydrogen containing gas" refers to a gas comprising $H_2$ or deuterium or tritium analogues thereof. In an embodiment, the hydrogen containing gas comprises one or more selected from the group of $H_2$, HD, $D_2$, HT, DT, $T_2$. Hence, the term "hydrogen containing gas" refers to a gas selected from the group of a $H_2$, $D_2$, $T_2$, HD, HT and DT containing gas. A halogen containing gas or a hydrogen containing gas may further comprise additional components like buffer gasses, such as Ar, etc. A "flow of hydrogen radicals" refers to a gas flow, wherein in the gas also hydrogen radicals are present. Usually, such a gas will also contain hydrogen molecules (like one or more of $H_2$, HD, $D_2$, HT, DT, $T_2$), since not all hydrogen may be converted into radicals, and due to radical recombination. The term "hydrogen radical containing gas" refers to a gas comprising hydrogen radicals or deuterium or tritium analogues thereof. Such gas may further comprise other components like $H_2$, etc., which has not been dissociated or has recombined from hydrogen radicals. The term "hydrogen containing gas source" refers to one or more sources of gas, wherein the gas at least contains molecular hydrogen (and/or analogues thereof, see above). The term "hydrogen radical source" refers to a device that converts at least part of the hydrogen gas (of the hydrogen containing gas) into hydrogen radicals, such that a hydrogen radical containing gas is provided. The phrase "converting at least part of the hydrogen containing gas into a hydrogen radical containing gas" refers herein to the process wherein at least part of the total amount of hydrogen molecules of the hydrogen containing gas (from the hydrogen containing gas source) is converted (by photo dissociation) into hydrogen radicals, thereby forming a hydrogen radical containing gas.

The term "lens", where the context allows, may refer to any one or combination of various types of optical components, comprising refractive, reflective, magnetic, electromagnetic and electrostatic optical components.

The terms "radiation" and "beam" used herein encompass all types of electromagnetic radiation, comprising ultraviolet (UV) radiation (e.g. having a wavelength λ of 365, 248, 193, 157 or 126 nm) and extreme ultra-violet (EUV or soft X-ray) radiation (e.g. having a wavelength in the range of 5-20 nm, e.g. 13.5 nm), as well as particle beams, such as ion beams or electron beams. Generally, radiation having wavelengths between about 780-3000 nm (or larger) is considered IR radiation. UV refers to radiation with wavelengths of approximately 100-400 nm. Within lithography, it is usually also applied to the wavelengths which can be produced by a mercury discharge lamp: G-line 436 nm; H-line 405 nm; and/or I-line 365 nm. VUV is Vacuum UV (i.e. UV absorbed by air) and refers to wavelengths of approximately 100-200 nm. DUV is Deep UV, and is usually used in lithography for the wavelengths produced by excimer lasers like 126 nm-248 nm. It should be appreciated that radiation having a wavelength in the range of, for example, 5-20 nm relates to radiation with a certain wavelength band, of which at least part is in the range of 5-20 nm.

The terms "cleaning arrangement" and "method for cleaning" refer to an arrangement and a method that may be used in a cleaning process. As mentioned below, providing hydrogen radicals may be used for reduction of oxides, like Sn oxides and in a next process, halogens (like for example $I_2$) may remove the metal, like Sn, by the formation of halides. Hence, "cleaning" in this context may imply a complete or partial removal of undesired deposition but may also imply a part of a cleaning process, like a reduction (without substantially removing deposition). Therefore, the term "cleaning" also comprises treating (treatment) with a gas in the course of a cleaning of a cleaning process. Further, in an embodiment hydrogen radicals may nevertheless be used to remove deposition (by formation of Sn-hydrides). The cleaning process may also be used to remove at least partially C (carbon) deposition (by the formation of volatile hydrocarbons such as $CH_4$). The phrase "to be cleaned" also refers to "to be partially cleaned".

Figure 2:
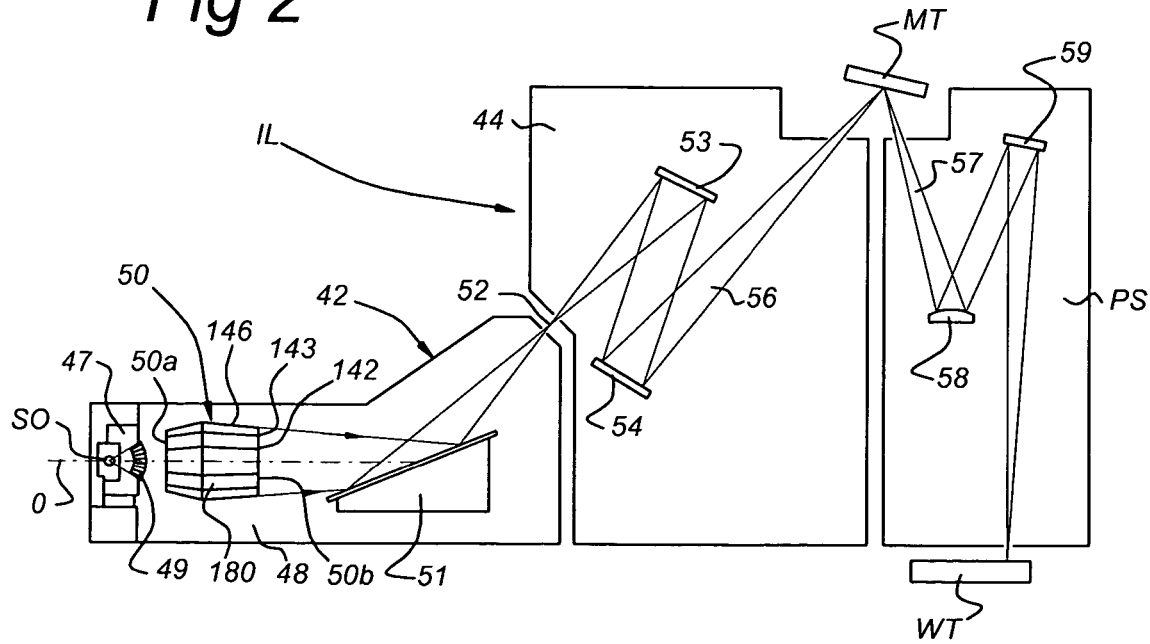
FIG. 2 depicts a side view of an EUV illumination system and projection optics of a lithographic apparatus according to FIG. 1.

FIG. 2 shows the projection apparatus 1 in more detail, comprising a radiation system 42, an illumination optics unit 44, and the projection system PS. The radiation system 42 comprises the radiation source SO which may be formed by a discharge plasma. EUV radiation may be produced by a gas or vapor, for example Xe gas, Li vapor or Sn vapor in which a very hot plasma is created to emit radiation in the EUV range of the electromagnetic spectrum. The very hot plasma is created by causing an at least partially ionized plasma by, for example, an electrical discharge. Partial pressures of, for example, 10 Pa of Xe, Li, Sn vapor or any other suitable gas or vapor may be required for efficient generation of the radiation. The radiation emitted by radiation source SO is passed from a source chamber 47 into a collector chamber 48 via a gas barrier or contaminant trap 49 which is positioned in or behind an opening in source chamber 47. The gas barrier 49 may comprise a channel structure.

The collector chamber 48 comprises a radiation collector 50 (also called collector mirror or collector) which may be formed by a grazing incidence collector. Radiation collector 50 has an upstream radiation collector side 50a and a downstream radiation collector side 50b. Radiation passed by collector 50 can be reflected off a grating spectral filter 51 to be focused in a virtual source point 52 at an aperture in the collector chamber 48. From collector chamber 48, a beam of radiation 56 is reflected in illumination optics unit 44 via normal incidence reflectors 53, 54 onto a reticle or mask positioned on reticle or mask table MT. A patterned beam 57 is formed which is imaged in projection system PS via reflective elements 58, 59 onto wafer stage or substrate table WT. More elements than shown may generally be present in illumination optics unit 44 and projection system PS. Grating spectral filter 51 may optionally be present, depending upon the type of lithographic apparatus. Further, there may be more mirrors present than those shown in the figures, for example there may be 1-4 more reflective elements present than 58, 59. Radiation collectors 50 are known from the prior art. Reference number 180 indicates a space between two reflectors, e.g. between reflectors 142 and 143.

Instead of a grazing incidence mirror as collector mirror 50, also a normal incidence collector may be applied. Collector mirror 50, as described herein in an embodiment in more detail as nested collector with reflectors 142, 143, and 146, and as schematically depicted in FIGS. 3c-3f, is herein further used as example of a collector. Hence, where applicable, collector mirror 50 as grazing incidence collector may also be interpreted as collector in general and in an embodiment also as normal incidence collector.

Further, instead of a grating 51, as schematically depicted in FIG. 2, also a transmissive optical filter may be applied. Optical filters transmissive for EUV and less transmissive for or even substantially absorbing UV radiation are known in the art. Hence, "grating spectral purity filter" is herein further indicated as "spectral purity filter" which includes gratings or transmissive filters. Not depicted in schematic drawings 3a and 3b, but also included as optional optical element may be EUV transmissive optical filters, for instance configured upstream of collector mirror 50, or optical EUV transmissive filters in illumination unit 44 and/or projection system PS.

Herein the terms "upstream" and "downstream" with respect to optical elements indicate positions "optically upstream" and "optically downstream" respectively. The beam of radiation B passes through lithographic apparatus 1. Following the light path that beam of radiation B traverses through lithographic apparatus 1, a first optical elements closer to source SO than a second optical element is configured upstream of the second optical element; the second optical element is configured downstream of the first optical element. For instance, collector mirror 50 is configured upstream of spectral filter 51, whereas optical element 53 is configured downstream of spectral filter 51.

All optical elements shown in FIG. 2 (and optical elements not shown in the schematic drawing of this embodiment) are vulnerable to deposition of contaminants produced by source SO, for example, Sn. This is the case for the radiation collector 50 and, if present, the spectral purity filter 51. Hence, the cleaning device according to the invention may be used to clean one or more of these optical elements as well as the cleaning method of the present invention may be applied to those optical elements, but also to normal incidence reflectors 53, 54 and reflective elements 58, 59 or other optical elements, for example additional mirrors, gratings, etc.

Radiation collector 50 may be a grazing incidence collector. The collector 50 is aligned along an optical axis 0. The source SO or an image thereof is located on optical axis O. The radiation collector 50 may comprise reflectors 142, 143, 146 (also known as a Wolter-type reflector comprising several Wolter-type reflectors). Sometimes they are also called a shell. These reflectors 142, 143, 146 may be nested and rotationally symmetric about optical axis 0. In FIG. 2, an inner reflector is indicated by reference number 142, an intermediate reflector is indicated by reference number 143, and an outer reflector is indicated by reference number 146. The radiation collector 50 encloses a certain volume, i.e. the volume within the outer reflector(s) 146. Usually, this volume within outer reflector(s) 146 is circumferentially closed, although small openings may be present. All the reflectors 142, 143 and 146 comprise surfaces of which at least part comprises a reflective layer or a number of reflective layers. Hence, reflectors 142, 143 and 146 (more reflectors may be present and embodiments of radiation collectors (also called collector mirrors) 50 having more than 3 reflectors or shells are comprised herein), are at least partly designed for reflecting and collecting EUV radiation from source SO, and at least part of the reflector may not be designed to reflect and collect EUV radiation. For example, at least part of the back side of the reflectors may not be designed to reflect and collect EUV radiation. The latter part may also be called back side. On the surface of these reflective layers, there may in addition be a cap layer for protection or as optical filter provided on at least part of the surface of the reflective layers.

The radiation collector 50 may be placed in the vicinity of the source SO or an image of the source SO. Each reflector 142, 143, 146 may comprise at least two adjacent reflecting surfaces, the reflecting surfaces further from the source SO being placed at smaller angles to the optical axis O than the reflecting surface that is closer to the source SO. In this way, a grazing incidence collector 50 is configured to generate a beam of (E)UV radiation propagating along the optical axis O. At least two reflectors may be placed substantially coaxially and extend substantially rotationally symmetric about the optical axis O. It should be appreciated that radiation collector 50 may have further features on the external surface of outer reflector 146 or further features around outer reflector 146, for example a protective holder, a heater, etc.

During use, on one or more of the outer 146 and inner 142/143 reflector(s) deposition may be found, especially Sn when a Sn source SO is used. Deposition of Sn, for example due to a Sn source, may, after a few mono-layers, be detrimental to reflection of the radiation collector 50 or other optical elements, which may necessitate the cleaning of such optical elements. Detrimental herein refers to reduction and loss of reflectivity of those reflecting surfaces of the reflector or mirror that is designed to reflect (and/or collect) radiation. Further, deposition of carbon may be found.

Deposition, for example deposition comprising Sn, may be removed in an embodiment by halogens (as gasses), for example, $F_2$, $Cl_2$, $Br_2$ and $I_2$ and, in another embodiment by hydrogen radicals, and in yet a further embodiment by combinations of hydrogen radicals and one or more halogens, either applied simultaneously or subsequently. In case there is a deposition with e.g. Sn, due to the presence of small amounts of oxygen, there will usually also be to some extent Sn oxide. To remove Sn oxides, a reduction step may be necessary before elemental Sn can be removed. Hence, in an embodiment, the cleaning process of surface to be cleaned may comprise the process of providing hydrogen radical containing gas to surface to be cleaned. In yet another embodiment, the cleaning process comprises the process of providing hydrogen radical containing gas to surface to be cleaned wherein hydrogen radical containing gas further comprises one or more halogen gasses (such as mentioned above). In another embodiment, the cleaning process of surface to be cleaned may comprise the process of providing hydrogen radical containing gas to surface to be cleaned and subsequently providing hydrogen radical containing gas to surface to be cleaned wherein hydrogen radical containing gas further comprises one or more halogen gasses. In yet another embodiment, the cleaning process of surface to be cleaned may comprise the process of providing hydrogen radical containing gas to surface to be cleaned and subsequently providing a halogen containing gas to surface to be cleaned. The processes of these embodiments may optionally further comprise subsequently providing hydrogen radical containing gas to surface to be cleaned. With these processes, Sn and/or C may be removed, and are especially applicable for the removal of Sn.

Hence, hydrogen radicals, either for reduction or for removal have to be provided to at least part of a surface of collector 50, or at least part of a surface to be cleaned of other optical elements. Such surfaces are e.g. the EUV reflecting surfaces of reflectors 142, 143 and 146 which are contaminated with deposition like Sn. Further, hydrogen radicals may be used to remove carbon deposition by formation of volatile hydrocarbons.

Referring to FIGS. 1 and 2, different optical elements may have to be at least partially cleaned from e.g. Sn and/or C deposition. In an embodiment, an optical element is selected from the group of collector mirror 50, radiation system 42 (also known as source collector module), illumination system IL and projection system PS (also known as projection optics box POB). In an embodiment, the module to be cleaned may also be a spectral purity filter 51. In yet another embodiment, the module to be cleaned may also be a mask, in particular a reflective multilayer mask. The surface to be at (least partially) cleaned may comprise the surface of an optical element selected from the group of optical elements contained in radiation system 42, like collector mirror 50 (be it a normal incidence collector or grazing incidence collector), spectral purity filter 51 (grating or transmissive filter), radiation system (optical) sensors (not depicted), optical elements contained in illumination system 44, like mirrors 53 and 54 (or other mirrors, if presents) and illumination system (optical) sensors (not depicted), optical elements contained in the projection system PS, like mirrors 58 and 59 (or other mirrors, if presents) and projection system (optical) sensors (not depicted). In an embodiment, the term "optical element" also comprises contaminant barrier 49. Hence, the term optical element refers to one or more elements selected from the group of a grating spectral filter, a transmissive optical filter, multi-layer mirrors, coating filters on multi-layer mirrors, grazing incidence mirrors, normal incidence mirrors (such as a multi-layer collector), grazing incidence collectors, normal incidence collectors, and also (optical) sensors and contaminant barrier 49. The cleaning method of the invention may also be used to clean other surfaces than surfaces of optical elements, such as walls, supporting structures, gas locks, etc.

The terms "optical element", "surface to be cleaned", also related to a plurality of "optical elements" and "surfaces to be cleaned", respectively.

Cleaning of optical elements of the lithographic apparatus 1 and the cleaning of arrangement 250 are explained with reference to collector 50, wherein collector 50 comprises at least a plurality of reflectors as described above. However, the cleaning arrangement 250 as depicted in FIGS. 3a-3f can also be used for cleaning of other optical elements (such as mentioned above).

Figure 3A:
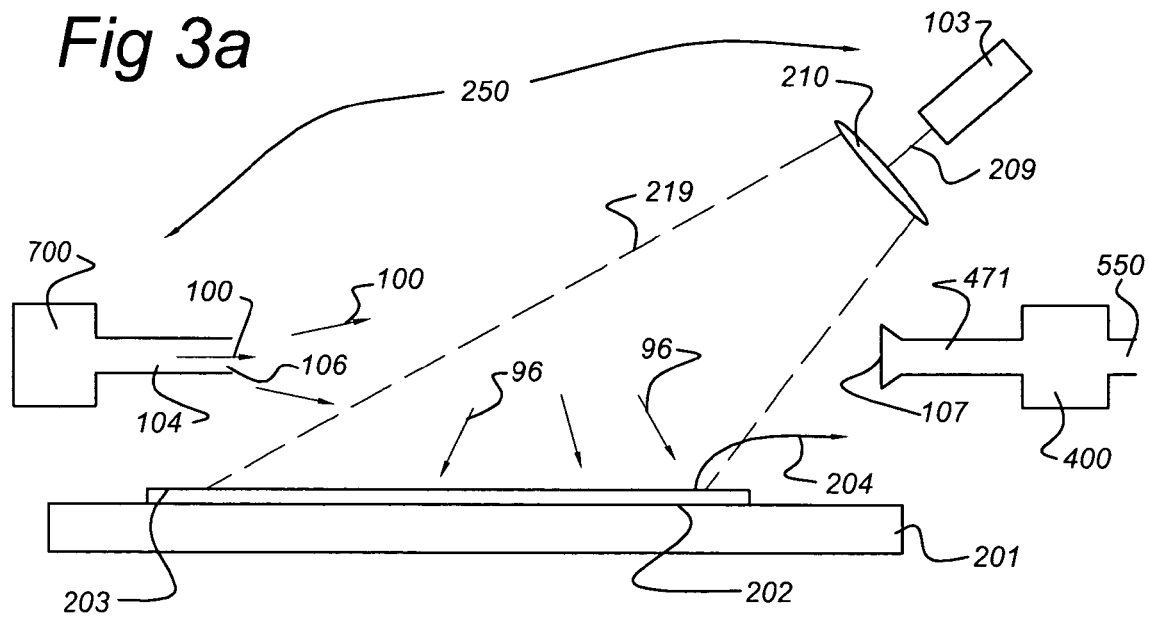

Referring to FIG. 3a, a cleaning arrangement 250 (which may especially be designed for cleaning a surface 202 to be cleaned of an optical element 201 of lithographic apparatus 1), comprises a hydrogen gas source 700 and a hydrogen radical source 103, which are configured to provide a hydrogen radical containing gas 96 to at least part of surface 202 to be cleaned. Surface 202 may be the surface of optical element 201. In an embodiment, optical element comprises collector mirror 50. Surface 202 of optical element 201 may be contaminated with carbon, with tin or with both carbon and tin.

Also other contaminants may be present. The contaminants are schematically indicated with deposition 203, although it should be appreciated that the contaminations do not necessarily form layer-like depositions.

Hydrogen containing gas source 700 may be configured to provide a hydrogen containing gas, a deuterium containing gas, etc, as mentioned above. Hence, source 700 is configured to provide a hydrogen containing gas, which is indicated by reference number 100. This gas exits source 700 via outlet 106, which may be the opening of a tube 104. Tube 104 is in gaseous contact with source 700 and may be configured to provide gas 100 at a predetermined position, for instance within a few centimeters of a surface to be cleaned, here indicated as surface 202, for example within about 2-50 cm of at least part of surface 202 of optical element 201 to be cleaned. In an embodiment, outlet 106 is less then about 10 cm from at least part of surface 202 to be cleaned from contaminants by hydrogen radicals 96 and/or to be treated by these radicals 96.

In an embodiment, tube 104 may be moveable, for instance to be positioned at predetermined positions between two shells of collector mirror 50 (as indicated with reference number 180 in FIG. 2). The terms "outlet 106" and "tube 104" may comprise embodiments with a plurality of outlets 106 and tubes 104, respectively.

The hydrogen containing gas 100 at least partially flows in the direction of the surface 202 to be cleaned, for instance due to a pump configured to induce a gas flow in tube 104 (such pump, which may be independent from optional pump 400, is not depicted in the figures), or due an overpressure in source 700 relative to the pressure of the volume wherein optical element 201 is configured, or due to an exhaust pump 400. Combination of two or more may be used, such as a pump configured to provide a flow 100 through tube 104 and pump 400, configured to exhaust gas from the volume wherein the optical element 201 to be cleaned is configured. In the configuration schematically depicted in FIG. 3a, a flow will be provided to the surface 202 to be cleaned. This flow initially comprises flow 100, which is the hydrogen containing gas. Further, in addition to the above, the term "flow" may also include diffusion of hydrogen gas 100 and where applicable also diffusion of hydrogen radicals 96. Hence, when using a flow of hydrogen containing gas 100, this flow may be but is not necessarily directed in the direction of surface 202 to be cleaned. Volatile reaction products may, due to diffusion, also diffuse away from surface 202.

In the area where radiation source 103 irradiates light with a wavelength in the range of the dissociation energy (see below), at least part of the total number of hydrogen molecules will dissociate into hydrogen radicals: a hydrogen radical containing gas 96 is provided. The volume irradiated by radiation source 103 is schematically indicated by area 219 enclosed by the dashed lines. In the schematic drawing 2a and 2b, an embodiment is shown wherein hydrogen radical source 103 irradiates both the hydrogen containing gas 100 and surface 202 to be cleaned (i.e. surface 202 and/or deposition 203 is irradiated by beam 209).

Herein, the term "hydrogen radical source 103" refers to a source of optical radiation, especially radiation with an energy that leads to (i.e. induces) photo dissociation of hydrogen molecules which are irradiated by the radiation of the hydrogen radical source 103. Hydrogen radical source 103 produces by its radiation 209 hydrogen radicals 96 from the hydrogen molecules 100. Hence, hydrogen radical source 103 is not a radical source per se, in that it can generate hydrogen radicals as stand alone apparatus, but due to the combination of a source 700 of hydrogen containing gas 100 and radiation 209 (i.e. the irradiated volume indicated with reference number 219) of hydrogen radical source 103, hydrogen radical source 103 is able to produce hydrogen radicals 96. Hydrogen radical source 103 irradiates at least part of the hydrogen containing gas flow 100. Hence, "hydrogen radical source 103" is herein also indicated as "source of radiation 103" or "radiation source 103" As described in more detail below, in an embodiment source of radiation 103 is an additional source of radiation (i.e. additional to EUV source SO), and in another embodiment, source or radiation 103 may be source SO, especially in combination with an UV transmissive filter that reduces EUV radiation of source SO.

The flow of the hydrogen radical containing gas is in an embodiment at least 1 m/s.

At least part of the contaminants 203 will be removed, for instance as volatile hydrides (like $CH_4$, $SnH_4$ etc. or halides, like Sn-halides such as Sn chlorides or Sn iodides, etc.), but also $H_2O$ may be formed (in case Sn oxides are reduced to Sn) (see above) and be removed. Removal of the volatilized contaminations is indicated with reference number 204. The volatile contaminates may be removed via an exhaust. In an embodiment, the volatile contaminations are at least partly exhausted by pump 400. Pump 400 comprises an opening or inlet (exhaust opening) or plurality of openings 107 and an exhaust 550. Optionally, opening 107 may be provided into tube 471, which is in gaseous contact with pump 400. In an embodiment, tube 471 may be movable to predetermined positions close to the surface to be cleaned, such that tube 471 may be positioned to exhaust the volatilized contaminants 204 due to the treatment with hydrogen radicals, and optionally halogens.

The radiation 209 emitted by source of radiation 103 may be expanded by an optional beam expander 210. Likewise, if desired and depending upon the type of source 103, a focusing lens may be used. More optics may be present to provide a beam of radiation 209. In an embodiment, source of radiation 103 and optional other optics 210, such as a beam expander, may be configured to scan surface 202 of optical element 201.

In an embodiment, hydrogen radical source 103, which is also indicated as source of radiation 103, is a source different from the EUV source SO (depicted in FIGS. 1 and 2). This implies that next to source SO, at least one or more sources 103 may be attached to lithographic apparatus 1 or may be integrated into lithographic apparatus 1. For instance, in an embodiment radiation system 42 may comprise at least one hydrogen radical source 103, in an embodiment illumination system IL (44) may comprise at least one hydrogen radical source 103 and projection system PS may comprise at least one hydrogen radical source 103. A plurality of hydrogen containing gas sources 700 and/or a plurality of outlets 106 of hydrogen containing gas sources 700 may be used to serve the different modules (systems) with a hydrogen containing gas 100. Likewise, a plurality of exhaust openings 107 and/or a plurality of pumps 400 may be used to exhaust gas.

In an embodiment, source of radiation or hydrogen radical source 103 comprises a source designed to provide radiation 209 with an energy which is enough to dissociate hydrogen molecules. The source of radiation which induces photo dissociation of the hydrogen may comprise an UV (i.e. a radiation wavelength in the range of about 100-400 nm) source. Further, in an embodiment source of radiation 103 which induces photo dissociation of the hydrogen comprises a high power UV source. In an embodiment, the wavelength or wavelength range of the radiation 209 of source 103 is within the energy range wherein photo dissociation of the hydrogen molecules is possible. For instance, for $H_2$, a suitable wavelength of the radiation 209 of source of radiation 103 may be about 270 nm. At this wavelength hydrogen molecules in flow 100 are dissociated into radicals by radiation 209, such that hydrogen radical containing gas 96 is generated.

Source of radiation 103 may be selected from broad band sources and narrow band sources, such as high pressure mercury lamps, deuterium lamps and lasers, etc. One may use also more than one source. Hence, reference 103 comprises one or more sources of radiation 103. For instance, one may use different sources with different radiation wavelengths in case gas mixtures, such as $H_2$ and $D_2$, etc., are used. One may also use a plurality of sources in order to increase the flux of radiation, and thus the cleaning/removal process. Source 103 may further comprise optics and optical devices to tune or change the wavelength, such as a Raman shifter, frequency changing crystals (frequency doublers, triplers, etc.), ethalons, dye cells, etc. In an embodiment, source of radiation 103 comprises a laser source, such as an excimer laser (optionally in combination with a frequency shifter, such as a dye laser, for selecting the wavelength for dissociation when not provided by the excimer laser directly).

Hence, in the embodiment schematically depicted in FIG. 3a, radiation 209 from a source of radiation 103 is directed towards surface 202 that needs to be cleaned. This surface 202 can for example be the multi-layer of a grazing incidence mirror, such as collector mirror 50 and spectral purity filter 51, but may also be the surfaces of the channels in the channel structure of contaminant barrier 49. A flow of hydrogen ($H_2$) is directed over the surface 202 to be cleaned. Upon entering the illuminated area 219, at least part of the total amount of molecular hydrogen 100 will be transferred into H-radicals 96, which will remove Sn and/or C deposits 203 from surface 202. An advantage of this embodiment is that when using a laser source, the wavelength of radiation 209 can be tuned to an optimized wavelength for breaking the H—H bond. Due to this, hydrogen radicals 96 can be generated with the highest efficiency, and thus it may require relatively low power to generate the hydrogen radicals 96. This may advantageously imply that the temperature of the optical element 201 during cleaning and after cleaning is relatively low. For instance, when using hot filaments to generate radicals, the temperature may be substantially higher, which may imply that optics are damaged or loose their alignment.

Figure 3B:
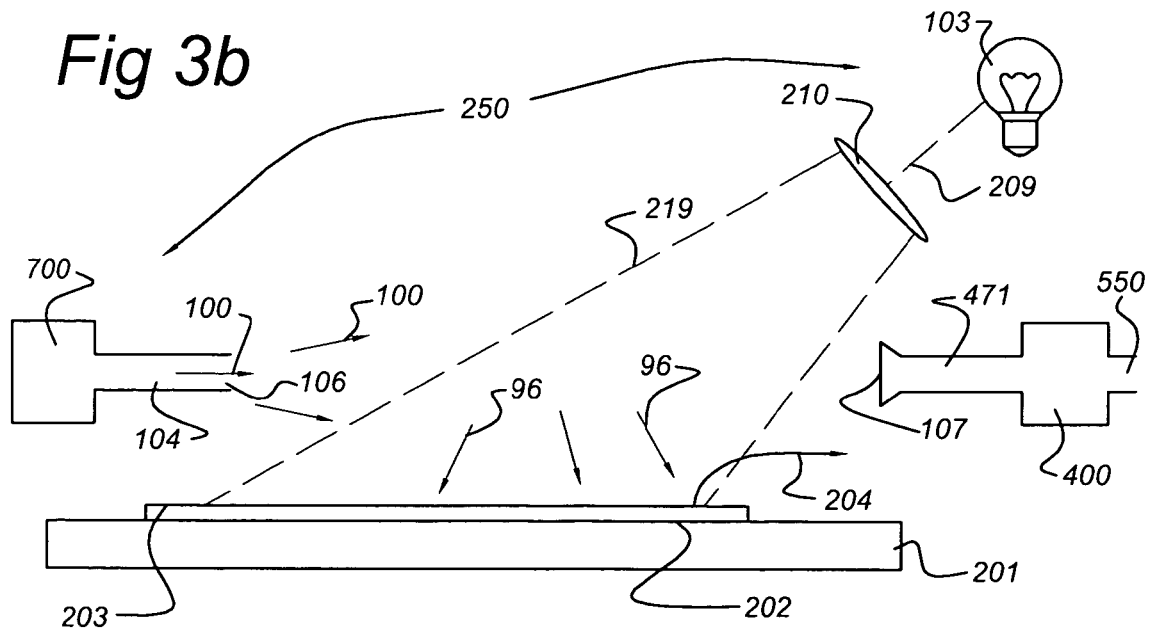

FIG. 3b schematically shows the same embodiment as described above, but now using a (high power) UV source as source of radiation 103, such as a (high power) mercury lamp or a (high power) deuterium lamp, etc. For instance, a Hg lamp may be used. An advantage of this embodiment is that compared to some laser sources, very high power sources are available. In an embodiment, a high power mercury lamp is used of 800 Watt or higher, for instance at least 1000 Watt. More hydrogen radicals 96 may be generated compared to the above described embodiment, and thus a faster cleaning rate may be achieved (comparing the same number of radiation sources 103). A UV (broad band) light source is smaller and cheaper than an UV laser source.

In a variant of this embodiment, optics 210 are comprised. These optics may comprise focusing or defocusing lenses (see above), but may also comprise optical filters. In yet another embodiment, optics 210 comprises a filter that is designed to diminish radiation that is not able to dissociate hydrogen molecules ("useless radiation") relative to useful radiation (i.e. radiation that does dissociate hydrogen). For instance, a band pass filter may be used to that is transmissive for at least part of the radiation within the photo dissociation range and is not transmissive or is less transmissive for at least part of the radiation that does not dissociate hydrogen molecules, i.e. a filter that passes frequencies in a desired range (wavelength with the energy of photo dissociation) and attenuates frequencies below and above. For instance, a band pass filter for about 270 nm may be used for the dissociation of $H_2$. An advantage of using such optical filters 210 is that in this way the surface to be cleaned 202 of optical element 201 is not unnecessarily heated by radiation that is not useful. Thereby, damage an/or misalignments are minimized. The optics 210 may be of a reflective or transmissive character. Further, optics 210 may comprise a number of optics.

Above described embodiments are suitable for cleaning optical elements such the contaminant barrier 49, collector mirror 50, spectral purity filter 51, mirrors 53, 54, 57, 58 (and other mirrors, if present), other reflective or transmissive optical filters not depicted, optical sensors, etc.

Figure 3C:
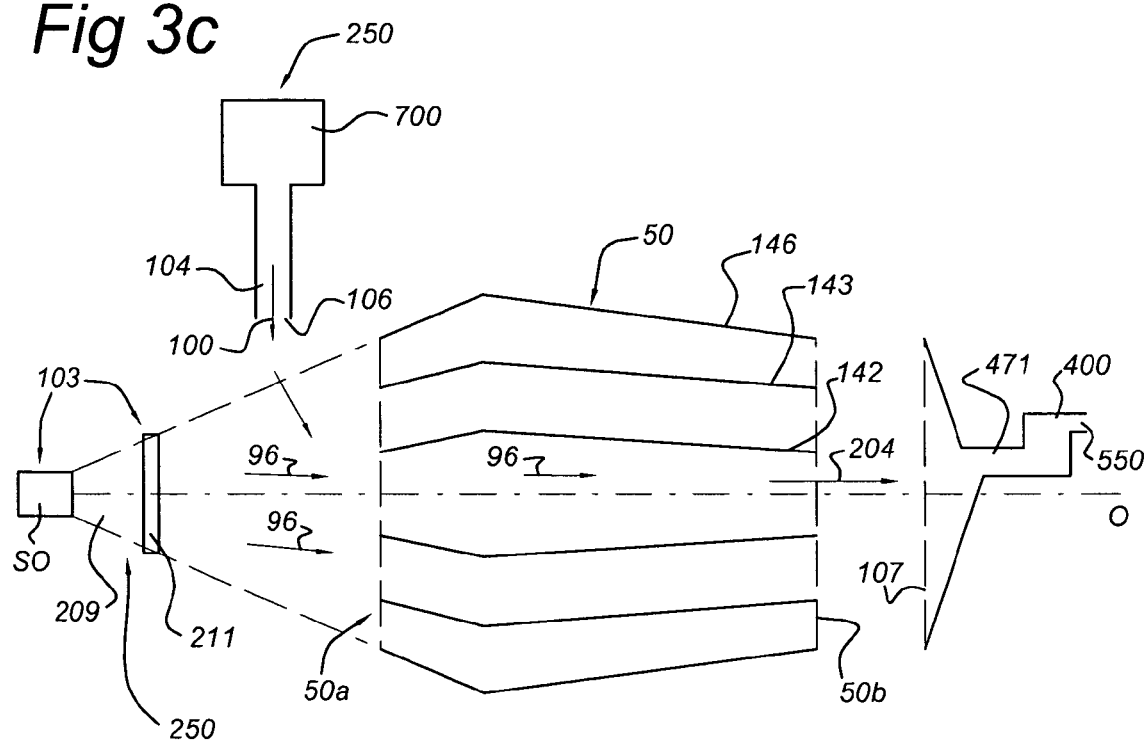
Figure 3D:
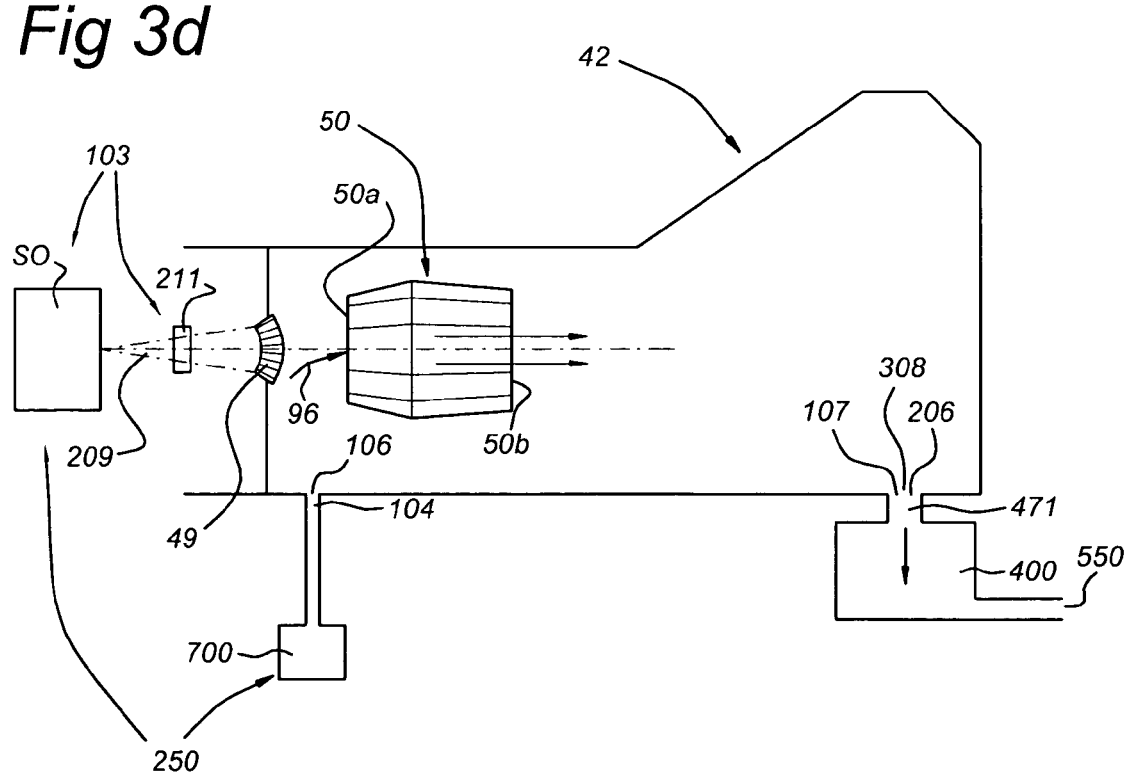

An embodiment for cleaning collector mirror 50 is schematically depicted in FIGS. 3c-3e. Here, in an embodiment, source of radiation 103 is not an additional source, but comprises source SO, i.e. source SO is source of radiation 103. In an embodiment, source SO is an EUV source, such as a Sn source, which is known in the art. Such EUV sources however also emit some radiation in the DUV/UV range. This radiation may be used to dissociate hydrogen molecules 100 from hydrogen source 700 into a hydrogen radical containing gas 96 which cleans surface 202 (not indicated) of shells 142, 143 and 146 or surfaces 202 of other optical elements within lithographic apparatus 1. In a specific variant, optically downstream of source of radiation 103 and optically upstream of the optical element to be cleaned, filter 211 is configured. This filter may be reflective or transmissive. In an embodiment, filter 211 is transmissive. This filter is configured and designed to be transmissive for at least part of the radiation within the photo dissociation range and is not transmissive or is less transmissive for at least part of the radiation that does not dissociate hydrogen molecules, i.e. a filter that passes frequencies in a desired range (wavelength with the energy of photo dissociation) and attenuates frequencies below and/or above. In an embodiment, a band pass filter is applied, which attenuates frequencies below and above the energy of the dissociation energy. Optical filter 211 is positionable. This implies that during cleaning filter 211 may be present and during the lithographic process, filter 211 is removed.

As mentioned above, EUV source SO does not only generate EUV radiation, but also other light frequencies, such as UV. The UV can be used to generate hydrogen molecules, but a problem may be that the EUV radiation from source SO (i.e. here also source of radiation 103) will generate ionized hydrogen, which can damage the optics, such as collector mirror 50. In order to circumvent this, filter 211 is used. This embodiment does not require substantially (additional) space, since the naturally present source SO in combination with optical filter 211 is used as hydrogen radical source 103. Hence, in this embodiment, source of radiation 103 comprises source SO, which emits EUV and UV radiation, and optical filter 211 which is designed to decrease the EUV radiation relative to the UV radiation.

FIG. 3d shows a variant of this embodiment in more detail. In case optional contaminant barrier 49 is present, filter 211 may configured optically downstream (i.e. between contaminant barrier 49 and collector mirror 50) of contaminant barrier 49 or optically upstream of contaminant barrier 49 (i.e. between source SO and contaminant barrier 49). The latter embodiment may be suitable for treating contaminant barrier 49 with hydrogen radicals 96; the former may be suited for treating collector mirror 50 with hydrogen radicals 96. In the latter case, outlet 106 of hydrogen containing gas source 700 may be configured to provide a gas flow 100 through contaminant barrier 49. In the embodiment schematically depicted in FIG. 3d, cleaning arrangement 250 is configured to provide a gas flow with hydrogen radicals 96 through collector mirror 50. By adjusting the position of exhaust opening 107 of optional exhaust pump 400 and the position of outlet 106 of hydrogen containing gas source 700, the direction of hydrogen radical containing gas flow 96 can be adjusted.

In an embodiment, collector mirror 50 or other optical elements to be treated with hydrogen radicals (such as optional contaminant barrier 49), may (in situ) be separated from the rest of the lithographic apparatus 1. The element to be cleaned is enclosed by a circumferential hull 500, as schematically depicted in FIGS. 3e and 3f, here with respect to collector mirror 50. Hull 500 comprises an outlet 106 for hydrogen containing gas 100 and an exhaust opening 107, for removal of gasses by pump 400 to exhaust 550. Hence, lithographic apparatus 1 is provided, wherein EUV source SO further emits radiation having a wavelength in the UV, lithographic apparatus 1 further comprising optical filter 211 positionable between EUV source SO and the surface to be cleaned and wherein optical filter 211 is configured to diminish EUV radiation relative to UV radiation.

As described above, the outlet 107 and exhaust opening 107 are configured to provide a gas flow through at least part of collector mirror 50. In case other optical elements are cleaned or other types of collector mirrors 50 are to be cleaned than schematically depicted in FIGS. 3c-3e, hydrogen gas outlet 106 and opening 107 are configured to provide a flow over at least part of the surface to be cleaned. In case a contaminant barrier 49 is to be cleaned, hydrogen gas outlet 106 and opening 107 are configured to provide a flow through at least part of contaminant barrier 49.

Further, circumferential hull 500 at least comprises one filter 211, which is configured and designed to transmit at least part of the radiation 209 which induces photo dissociation of the hydrogen of source SO, such that surface 202 to be cleaned can be irradiated by source SO (source of radiation 103). Like the embodiment schematically depicted in FIG. 3d, this embodiment comprises source SO, in combination with filter 211, as hydrogen radical source 103.

In this embodiment, the treatment process is separated from the rest of lithographic apparatus 1, and thus for instance contamination elsewhere in lithographic apparatus 1 by redeposition of volatile hydrides (204) may be minimized. In fact, a reactor is provided, wherein the hydrogen radical treatment is performed.

Optionally, circumferential hull 500 may further comprise a second filter 211b, configured downstream of the optical element to be cleaned and configured to pass at least part of radiation 209 through the rest of the apparatus. For instance, radiation that transmits through filter 211b may be used to irradiate optical elements 53, 54, etc.

Using a source SO as hydrogen radical source 103 allows the illuminated area on the optics to be treated by the radiation for dissociation of hydrogen molecules is substantially the same as that illuminated by the EUV radiation in the absence of filter 211 (and optional filter 211b). Hence, a good irradiation may be achieved, especially for the reflective surface(s) of collector mirror 50, whereas when additional sources 103 are used, it may be more complicated to irradiate the entire surface of the reflective surfaces of collector mirror 50. When using collector mirrors with bent surfaces, such as the above described Wolter collector mirror, this may be a desired embodiment.

Circumferential hull 500 may be a cocoon-like hull, comprising one or two doors, at least one door configured between source SO and the optical element to be cleaned, which door may comprise filter 211. A second door may be present, which may be configured downstream of the optical element to be cleaned, which second door may optionally comprise filter 211b.

Such doors are schematically indicated in FIG. 3e and in more detail in FIG. 3f with reference number 120 and reference number 130. Door 130 is optional. Here, source of radiation 103 (i.e. hydrogen radical source 103) is not depicted. Circumferential hull 500 may comprise hull 200 and door 120. Optionally, two doors may be present, which are in the schematic FIGS. 3e and 3f indicated with doors 120 and 130. Hull 200 is schematically depicted as circular hull 200, but other shapes may be used.

Other positions of optical filter 211 and optional filter 211b in circumferential hull 500 than in door 120 and optional door 130 are possible. For instance, they may be present in hull 200.

In FIG. 3f, hydrogen containing gas 100 enters through an opening (i.e. in the figure outlet 106) in door 120 and gas is removed by pump 400 through exhaust opening 107 via optional tube 471. The hydrogen radical source 103 irradiates hydrogen containing gas 100 within circumferential hull 500 through filter 211 (or optional filter 211) and thereby generates hydrogen radicals within circumferential hull 500, which thereby clean/treat a surface to be cleaned/treated of an optical element contained in circumferential hull 500.

Other positions of outlet 106 and exhaust 107 in circumferential hull 500 than in door 120 and optional door 130 are possible. For instance, they may be present in hull 200.

Here, cleaning arrangement 250 comprises a source 700 of a hydrogen containing gas 100, a source of radiation 103 (not depicted), circumferential hull 500 configured to enclose an optical element, circumferential hull 500 comprising at least one door 120, and optionally a second door 130, circumferential hull 500 further comprising outlet 106 configured to introduce hydrogen containing gas 100 from source 700 into the volume enclosed by circumferential hull 500 and an exhaust opening 107, configured to remove gas from circumferential hull 500, circumferential hull 500 further comprising a filter 211 and optionally a filter 211b, filter 211 configured to transmit at least part of radiation 209 of source of radiation 103 (i.e. at least part of the wavelength range wherein photo dissociation of hydrogen molecules can be induced is at least partially transmitted through filter 211 into circumferential hull 500), wherein source of radiation 103 and filter 211 are configured to irradiate at least part of the hydrogen containing gas contained in circumferential hull 500 thereby converting at least part of the total amount of hydrogen molecules in the hydrogen containing gas 100 introduced into the volume contained by circumferential hull 500 into a hydrogen radical containing gas 96, and wherein the cleaning arrangement is configured to provide a hydrogen radical containing gas to the surface of the optical element to be cleaned which optical element is contained in circumferential hull 500 (i.e. is configured in the volume enclosed by circumferential hull 500).

The cleaning arrangement as schematically depicted in FIGS. 3e and 3f may not only be used with source SO as hydrogen radical source 103, also a separate hydrogen radical source 103 source may be used. For instance, an UV source may be placed in front of filter 211 or optional filter 211b. More than one sources 103 may be used. Further, more than one filter may be used.

Assuming that cleaning arrangement 250 as schematically depicted in FIGS. 3e and 3f encloses collector mirror 50, an additional source of radiation 103 may be placed optically upstream of the collector mirror 50 (for instance between collector mirror 50 and optional contaminant barrier 49) to irradiate gas 100 contained by circumferential hull 500 through filter 211, and/or an additional source of radiation 103 may be placed optically downstream of collector mirror 50 to irradiate gas 100 contained by circumferential hull 500 through filter 211b. When using two or more filters 211/211b, at least one of the filters may be configured to transmit at least part of the radiation out of circumferential hull 500. The radiation escaping from circumferential hull 500 may be used to clean other optical elements (see also above).

The cleaning arrangement 250 including circumferential hull 500 may be used in situ in the lithographic apparatus 1, but may also be used ex situ. Further, such cleaning arrangement may be used to clean collector mirror 50, but also other elements such as contaminant barrier 49, other reflective or transmissive optical filters (as described above), etc. When using cleaning arrangement 250 including circumferential hull 500 for in situ cleaning, at least part of circumferential hull 500 is removable, to guarantee an substantially undisturbed beam of radiation B during lithographic processing. For instance, doors 120 and 130 may be movable, or filters 211 and 211b may be movable.

In the above described embodiments, as schematically depicted in FIGS. 3e and 3f, source of radiation 103 is either source SO or a source of radiation additional to source SO. An additional source of radiation 103 may be configured externally from circumferential hull 500. In yet another embodiment, the additional source of radiation 103 is configured within circumferential hull 400. In this embodiment, optical filter 211 and optional optical filter 211b are not necessary, although one or more of such filters may still be used to irradiate optical elements outside circumferential hull 500.

After treatment with hydrogen radicals and optionally halogens, filter 211 (either as separate filter or comprised in door 120) is removed. In case optional filter 211b is present (either as separate filter or comprised in door 130), also filter 211b is removed. Then, the lithographic process can be continued. Hence, filter 211 and optional filter 211b are positionable.

When using the embodiments described above, for example those with reference to FIGS. 3a and 3b, some optical elements may also be cleaned on line, i.e. during the lithographic process.

As mentioned above, optical filter 211 may be placed upstream of collector mirror 50 (i.e. optically upstream of collector mirror 50), or may be placed downstream of collector mirror 50 (i.e. optically downstream of collector mirror 50). In the latter embodiment, especially optical elements in the illumination area, see FIG. 2, reference number 44 (IL), and/or optical elements in the projection area, see FIG. 2, reference PS, may be irradiated with UV radiation.

In yet a further embodiment, a lithographic apparatus and cleaning method is provided for cleaning a surface to be cleaned of an optical element of a lithographic apparatus wherein the lithographic apparatus comprises an optical filter for reducing UV radiation (relative to EUV radiation), for instance a transmissive optical filter for reducing UV radiation, and wherein this filter for reducing UV radiation is removed. Thereby, UV radiation can propagate "undisturbed" through the lithographic apparatus and be used in the cleaning arrangement of the invention and in the cleaning method of the invention. In an embodiment, next to the removal of the optical filter for reducing UV optical filter 211 is configured in beam B optically upstream of the optical element(s) to be cleaned. This optical filter 211 may be the optical filter 211 as described above and schematically depicted in FIGS. 3a-3f, for example 3c-3e.

Cleaning arrangement 250 may be configured ex situ or in situ of lithographic apparatus 1. According to yet a further embodiment of the invention, there is provided the cleaning arrangement 250 per se, comprising hydrogen containing gas source 700 and hydrogen radical source 103, wherein hydrogen radical source 103 is configured to convert at least part of the hydrogen containing gas 100 into hydrogen radical containing gas 96, wherein cleaning arrangement 250 is configured to provide hydrogen radical containing gas 96 to surface 202 of optical element 201 to be cleaned, wherein hydrogen radical source 103 comprises a source of radiation 103 which induces photo dissociation of the hydrogen.

According to an embodiment of the invention, cleaning arrangement 250 is provided, further comprising circumferential hull 500 configured to enclose optical element 201, circumferential hull 500 comprising at least one door 120, circumferential hull 500 further comprising an outlet 106 configured to introduce hydrogen containing gas 100 from hydrogen containing gas source 700 into the volume enclosed by circumferential hull 500 and exhaust opening 107 configured to allow removal from gas from circumferential hull 500, circumferential hull 500 further comprising optical filter 211 configured to transmit at least part of radiation 209 of source of radiation 103, wherein source of radiation 103 and optical filter 211 are configured to irradiate at least part of hydrogen containing gas 100 contained in circumferential hull 500 thereby converting at least part of hydrogen containing gas 100 contained by circumferential hull 500 into hydrogen radical containing gas 96, wherein cleaning arrangement 250 is configured to provide hydrogen radical containing gas 96 to surface 202 of optical element 201 to be cleaned contained in circumferential hull 500.

According to yet a further embodiment of the invention there is provided a method for cleaning surface 202 to be cleaned of optical element 201 of lithographic apparatus 1. This may be a method in situ, i.e. a method for cleaning surface 202 to be cleaned of optical element 201 in lithographic apparatus 1. The method comprises leading hydrogen containing gas 100 to surface 202 to be cleaned and irradiating the gas 100 or surface 202 to be cleaned or both with radiation 209 which induces photo dissociation of the hydrogen. By irradiating the gas, hydrogen radicals will be generated, thereby providing hydrogen radical containing gas 96. By irradiating the surface 202 to be cleaned, hydrogen close to the surface 202 to be cleaned will dissociate into hydrogen radicals 96. In general, the surface 202 to be cleaned will be irradiated, although for the generation of hydrogen radicals it may also suffice to irradiate gas 100 only. For instance, source of radiation 103 might also be present in tube 104.

Tubes herein refer to gas tube or gas pipes, i.e. tubes for transporting gasses, such as hydrogen.

Gas flows may be in other directions than depicted.

The invention is not limited to EUV radiation alone, but may also be used for lithographic apparatus that use other radiation, as described above. Other contaminants as a result of other sources than Sn may also be removed by cleaning arrangement 250 and cleaning method of the invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. It should be appreciated hat, in the context of such alternative applications, any use of the terms "wafer" or "die" herein may be considered as synonymous with the more general terms "substrate" or "target portion" respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

While embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus, comprising:
   an EUV source; and
   a cleaning arrangement, the cleaning arrangement comprising
   a hydrogen containing gas source;
   a hydrogen radical source, wherein the hydrogen radical source is configured to convert at least part of the hydrogen containing gas into a hydrogen radical containing gas, the cleaning arrangement is configured to provide the hydrogen radical containing gas to a surface of an optical element to be cleaned, and the hydrogen radical source comprises a source of radiation; and
   a band pass filter configured to receive radiation from the source of radiation, and transmit radiation which induces photo dissociation of the hydrogen.

2. The lithographic apparatus according to claim 1, wherein the hydrogen containing gas comprises a gas selected from the group of a $H_2$, $D_2$, $T_2$, HD, HT and DT containing gas.

3. The lithographic apparatus according to claim 1, wherein the source of radiation which induces photo dissociation of the hydrogen comprises an UV source.

4. The lithographic apparatus according to claim 1, wherein source of radiation which induces photo dissociation of the hydrogen comprises a high power UV source.

5. The lithographic apparatus according to claim 4, wherein the source of radiation which induces photo dissociation of the hydrogen comprises a high pressure mercury lamp.

6. The lithographic apparatus according to claim 1, wherein the EUV source is configured to emit radiation having a wavelength in the UV range, the lithographic apparatus further comprising an optical filter positionable between the EUV source and the surface to be cleaned, the optical filter being configured to diminish EUV radiation relative to UV radiation.

7. The lithographic apparatus according to claim 6, wherein the optical filter is upstream of a collector mirror.

8. The lithographic apparatus according to claim 6, wherein the optical filter is downstream of a collector mirror.

9. The lithographic apparatus according to claim 1, wherein the surface to be cleaned is the surface of an optical element selected from the group of optical elements contained in a radiation system, optical elements contained in an illumination system and optical elements contained in a projection system.

10. The lithographic apparatus according to claim 1, wherein the optical element is selected from the group of reflective optical elements, transmissive optical elements, contaminant barriers and sensors.

11. The lithographic apparatus according to claim 1, wherein the optical element is selected from the group of normal incidence collector mirrors and grazing incidence collector mirrors.

12. The lithographic apparatus according to claim 1, wherein the cleaning arrangement further comprises a circumferential hull configured to enclose the optical element, the circumferential hull comprising
   a door;
   an outlet configured to introduce the hydrogen containing gas from the hydrogen containing gas source into a volume enclosed by the circumferential hull;
   an exhaust opening configured to allow removal of gas from the circumferential hull; and
   an optical filter configured to transmit at least part of the radiation of the source of radiation, wherein the source of radiation and the optical filter are configured to irradiate at least part of the hydrogen containing gas contained in the circumferential hull thereby converting at least part of the hydrogen containing gas contained by the circumferential hull into the hydrogen radical containing gas, wherein the cleaning arrangement is configured to provide the hydrogen radical containing gas to the surface of the optical element to be cleaned contained in the circumferential hull.

13. The lithographic apparatus according to claim 12, wherein the source of radiation comprises the EUV source.

14. The lithographic apparatus according to claim 12, wherein the source of radiation comprises a source of radiation different from the EUV source.

15. A lithographic apparatus, comprising:
   an EUV source;
   an illumination system configured to condition a radiation beam of the EUV source;
   a support configured to support a patterning device, the patterning device being configured to impart the radiation beam with a pattern in its cross-section to form a patterned radiation beam;
   a substrate table configured to hold a substrate;
   a projection system configured to project the patterned radiation beam onto a target portion of the substrate; and a cleaning arrangement, the cleaning arrangement comprising a hydrogen containing gas source; and a hydrogen radical source, wherein the hydrogen radical source is configured to convert at least part of the hydrogen containing gas into a hydrogen radical containing gas, the cleaning arrangement is configured to provide the hydrogen radical containing gas to a surface of an optical element to be cleaned, and the hydrogen radical source comprises a source of radiation; and a band pass filter configured to receive radiation from the source of radiation, and transmit radiation which induces photo dissociation of the hydrogen.

16. A cleaning arrangement, comprising a hydrogen containing gas source; and a hydrogen radical source, wherein the hydrogen radical source is configured to convert at least part of the hydrogen containing gas into a hydrogen radical containing gas, the cleaning arrangement is configured to provide a hydrogen radical containing gas to a surface of an optical element to be cleaned, and the hydrogen radical source comprises a source of radiation; and a band pass filter configured to receive radiation from the source of radiation, and transmit radiation which induces photo dissociation of the hydrogen.

17. The cleaning arrangement according to claim 16, comprising a circumferential hull configured to enclose an optical element, the circumferential hull comprising a door;

an outlet configured to introduce the hydrogen containing gas from the hydrogen containing gas source into the volume enclosed by the circumferential hull;

an exhaust opening configured to allow removal of gas from the circumferential hull; and an optical filter configured to transmit at least part of the radiation of the source of radiation, wherein the source of radiation and the optical filter are configured to irradiate at least part of the hydrogen containing gas contained in the circumferential hull thereby converting at least part of the hydrogen containing gas contained by the circumferential hull into the hydrogen radical containing gas, and the cleaning arrangement is configured to provide the hydrogen radical containing gas to a surface of the optical element to be cleaned contained in the circumferential hull.

18. The cleaning arrangement according to claim 17, wherein the source of radiation is arranged externally from the circumferential hull.

19. A method for cleaning a surface of an optical element of a lithographic apparatus comprising;

leading a hydrogen containing gas to the surface;

filtering radiation with a band pass filter; and irradiating the gas and/or the surface with radiation that has passed through the filter which induces photo dissociation of the hydrogen.

20. The method according to claim 19, wherein the surface is the surface of an optical element selected from the group of an optical element contained in a radiation system, an optical element contained in an illumination system and an optical element contained in a projection system.

* * * * *